(12) United States Patent
Sezi

(10) Patent No.: US 7,022,582 B2
(45) Date of Patent: Apr. 4, 2006

(54) MICROELECTRONIC PROCESS AND STRUCTURE

(75) Inventor: Recai Sezi, Rottenbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/631,587

(22) Filed: Jul. 31, 2003

(65) Prior Publication Data

US 2004/0126957 A1 Jul. 1, 2004

(30) Foreign Application Priority Data

Aug. 20, 2002 (DE) ................. 102 38 024

(51) Int. Cl.
*H01L 21/76* (2006.01)
*H01L 21/4763* (2006.01)

(52) U.S. Cl. ................. 438/422; 438/421; 438/619

(58) Field of Classification Search ................ 438/234, 438/421, 422, 613, 619, 652, 926
See application file for complete search history.

(56) References Cited

U.S. PATENT DOCUMENTS

| | | | | |
|---|---|---|---|---|
| 6,165,890 A | * | 12/2000 | Kohl et al. | 438/619 |
| 6,171,971 B1 | * | 1/2001 | Natzle | 438/706 |
| 6,211,561 B1 | | 4/2001 | Zhao | |
| 6,265,321 B1 | * | 7/2001 | Chooi et al. | 438/725 |
| 6,268,277 B1 | | 7/2001 | Bang | |
| 6,413,827 B1 | * | 7/2002 | Farrar | 438/296 |
| 6,690,081 B1 | * | 2/2004 | Bakir et al. | 257/522 |
| 2002/0019125 A1 | * | 2/2002 | Juengling et al. | 438/631 |

FOREIGN PATENT DOCUMENTS

| | | |
|---|---|---|
| JP | 01-137651 | 5/1989 |
| JP | 2000-260864 | 9/2000 |
| JP | 2001-326275 | 11/2001 |
| WO | 00/35000 | 6/2000 |
| WO | 00/51177 | 8/2000 |

* cited by examiner

*Primary Examiner*—Michael Trinh
*Assistant Examiner*—Pamela E Perkins
(74) *Attorney, Agent, or Firm*—Jenkins, Wilson, Taylor & Hunt, P.A.

(57) ABSTRACT

The present invention relates to a process for integrating air as dielectric in semiconductor devices, comprising the steps of:

a. applying a layer of a dielectric (2) which is to be patterned to a substrate (1);
b. patterning the dielectric layer (2) which has been applied;
c. applying a conductor metal (3) for the patterned dielectric layer (2) and forming a common surface from the conductor metal (3) and the dielectric (2);
d. applying a layer of an organic dielectric (4) to the layer produced in step c.; and
e. bringing the coated substrate produced in this way into contact with a fluorine-containing compound in order to form an arrangement which has air as dielectric between conductor structures and has a continuous dielectric layer (4) on the top side, and to a semiconductor device with air layers as dielectric produced using this process.

20 Claims, 4 Drawing Sheets

MICROELECTRONIC PROCESS AND STRUCTURE

TECHNICAL FIELD

The present invention relates to a process for the integration of air as dielectric in semiconductor devices and to semiconductor devices produced using the process according to the invention which include one or more air-dielectric layers.

BACKGROUND OF THE INVENTION

What is known as the interconnect delay will present a serious problem in future chip generations. Although the introduction of copper instead of aluminum has resulted in a significant improvement with regard to the signal propagation time (or the proportion of "R" in what is known as the RC delay; R=resistance, C=capacitance), but there is still a lack of practicable ways of improving the proportion of "C". The capacitive coupling C between the interconnects can be reduced by reducing the dielectric constant of the dielectric located between the metallic conductors. This problem cannot be solved by using the conventional dielectric silicon dioxide or its fluorinated variants, since these materials still have dielectric constants of over 3.

For some years, there has been work throughout the world on producing and integrating what are known as low k dielectrics, i.e. dielectrics with a low dielectric constant (k<3). Dielectrics of this type have dielectric constants of between 2.5 and 2.9, are already highly developed and are suitable for use from the 0.13 μm technology generation onward. Examples of these materials include Black Diamond (Advanced Materials), Oxazole Dielectric OxD (Infineon) or SiLK (Dow Chemical). The latter two materials, which are based on organic polymers, also have porous versions which are still in the development phase and reach k values of below 2.2. Moreover, there are numerous further porous inorganic materials, such as for example LKD produced by JSR, or XLK produced by Dow Corning.

WO 00/35000 A1 has described a process for producing semiconductor structures in which there are voids which surround connection lines and connection plugs, the voids being formed by removing an electrically conductive or semiconducting filler material.

U.S. Pat. No. 6,268,277 B1 has described a process in which semiconductor structures with voids are formed in dielectrics. In this case, passages which are in communication with voids are covered by deposition of a layer.

U.S. Pat. No. 6,211,561 B1 describes a process for producing semiconductor structures with voids in which air gaps are etched in and are then sealed with a layer.

WO 00/51177 describes the formation of semiconductor structures with air voids between interconnects. The air voids are formed by gaps by etching material.

US Patent application 2002/0019125 A1 describes the use of supportive elements for stabilizing voids in semiconductor structures.

U.S. Pat. No. 6,165,890 discloses a process for forming gaps in solid structures, in particular semiconductor structures, in which a polymer of the norbornene type is thermally decomposed, thereby leaving behind voids.

Air is known to have a dielectric constant of 1, and for this reason is recommended as the ideal dielectric. For this reason, there have hitherto been numerous attempts to use air as dielectric (known as air gaps). Example: Mark Lin, Mat. Res. Soc. Symp. Proc. Vol. 612 (2000), D.4.7.1 to D.4.7.6. However, previous air gap concepts either cannot be used for all feature sizes (i.e. are highly dependent on the design) or are so complex that they cannot be carried out economically.

SUMMARY OF THE INVENTION

Therefore, it is an object of the present invention to provide a process with which air as dielectric can be readily integrated in semiconductor devices.

According to the invention, this is achieved by a process according to claim 1 and the invention also relates to a semiconductor device according to claim 21.

The process according to the invention for the integration of air as dielectric in semiconductor devices comprises the following steps:

a. applying a layer of a dielectric (2) which is to be patterned to a substrate (1);
b. patterning the dielectric layer (2) which has been applied;
c. applying a conductor metal (3) to the patterned dielectric layer (2) and forming a common surface from the conductor metal (3) and the dielectric (2);
d. applying a layer of an organic dielectric (4) to the layer produced in step c.; and
e. bringing the coated substrate produced in this way into contact with a fluorine-containing compound in order to form an arrangement which has air as a dielectric between conductor structures and has a continuous dielectric layer (4) on the top side.

In this way, a simple process, which is not restricted with regard to the design of the semiconductor device, is provided, making it possible to obtain air gaps as dielectric.

The step of bringing the substrate into contact with a fluorine-containing compound as described in step e. surprisingly causes the dielectric which has been applied as in step a., in particular silicon dioxide, despite the (organic) dielectric membrane above it, to react with the fluorine-containing compound, and the reaction products diffuse out, so that an air hole or an air gap remains. Surprisingly, the membrane of the organic dielectric is not damaged by this process.

The fluorine-containing compound which is to be brought into contact with the semiconductor substrate which has been pretreated in accordance with the invention is in a preferred embodiment in gas form, in which case the fluorine-containing compound used is advantageously a fluorine-containing hydrocarbon compound with 1–4 C atoms, preferably 1–2 C atoms, a perfluorinated hydrocarbon compound with 1–4 C atoms, preferably 1–2 C atoms, a fluorine-containing nitrogen compound with 1–2 N atoms, a chlorofluorocarbon compound with 1–4 C atoms, preferably 1–2 C atoms, and/or HF, $F_2$, $BF_3$, $PF_3$, ClF, $ClF_3$, $ClF_5$, $XeF_2$, $SF_4$, $SO_2F_2$, $SF_6$ or mixtures thereof.

Examples of preferred hydrocarbon compounds with 1–4 C atoms are $CH_3F$, $CHF_4$ and/or $CH_2F_2$.

Examples of preferred fluorinated hydrocarbon compounds are compounds of the general formula $C_nF_{2n+2}$ where n=1–4, preferably n=1–2, in particular $CF_4$ or $C_2F_6$. The perfluorinated hydrocarbon compounds, in particular those of the formula $C_nF_{2n+2}$ where n=1–4, may preferably each have up to 50% of the F atoms replaced by H and/or Cl. Examples of preferred compounds of this type are $C_2H_2F_4$ and/or $C_2Cl_2F_4$.

An example of a preferred fluorine-containing nitrogen compound is $NF_3$.

Examples of preferred chlorofluorocarbon compounds are $C_2Cl_3F_3$ or $C_2Cl_4F_2$.

In particular, the compounds $CF_4$, $CHF_3$, $C_2F_6$ and/or $NF_3$ are preferred gaseous fluorine-containing compounds.

According to the invention, the fluorine-containing compounds used may also be used in a mixture with $NH_3$, $O_2$ or $H_2O$, provided that the latter substances do not have any harmful influence on the semiconductor structure. In general, suitable gases are in particular gaseous compounds which include C—F, C—H—F or N—F groups.

In a further preferred embodiment, the fluorine-containing compound may also be brought into contact with the pretreated semiconductor substrate in the form of a solution. In this case, the fluorine-containing compound is preferably in the form of an aqueous solution of HF, KF, NaF, LiF, $NH_4HF_2$, $NH_4F$ or mixtures thereof.

According to the invention, the step of bringing the substrate into contact with the fluorine-containing gaseous compound takes place at 20–200° C., preferably 50–100° C. The treatment time is in this case preferably 5–60 minutes, particularly preferably 10–30 minutes. The step of bringing the substrate into contact with the gaseous fluorine-containing compound preferably takes place at a pressure of 1 to 1000 mbar.

In the case of treatment with the fluorine-containing compound in solution form, heating to 30–60° C. is preferred.

The dielectric which is to be structured may be any desired dielectric which is customarily used in semiconductor structure fabrication, preferably an inorganic dielectric, e.g. the dielectrics mentioned in the introduction. The dielectric to be patterned in accordance with step a. is preferably silicon dioxide, silicon nitride or silicon oxynitride, with silicon dioxide being particularly preferred.

In principle, substrates which are used in semiconductor structure or chip fabrication are suitable in accordance with the invention. Substrates which are preferred in accordance with the invention are silicon, germanium, microelectronically processed Si or Ge substrates which have a dielectric on their top side, glass, metal-glass combinations; or Si or Ge with electrically semiconducting polymers, such as doped or undoped thiophenes or arylenes.

The initial application of the dielectric, preferably silicon dioxide, takes place to a layer thickness of preferably 100–2000 nm using conventional processes.

The dielectrics may be patterned indirectly, i.e. by means of an auxiliary resist, or directly, using conventional processes. In the case of direct patterning, the dielectric itself is photosensitive (cf. Example 6). The indirect patterning can be carried out not only using a resist which can be silylated, but also using a silicon-containing resist. Multilayer systems (organic dielectric/barrier layer/normal photoresist) are suitable. Examples of suitable barrier layers are silicon dioxide or spin-on glass materials.

According to the invention, the conductor metal used is preferably copper; by way of example, silver, aluminum or alloys of Al, Cu and Si are also suitable.

The conductor metal can be applied by means of CVD (Chemical Vapor Deposition) or PVD (Physical Vapor Deposition) techniques. The conductor metal layer, in particular the copper layer, may optionally be thickened by electroplating, so that it has the desired layer thickness. It is preferable for the conductor metal layer to have at least the layer thickness of the dielectric throughout.

The copper layer or conductor metal layer applied by means of, for example, CVD technology in accordance with step c. typically amounts to 30–200 nm, which can then be thickened by electroplating until it reaches the layer thickness of the dielectric.

It is advantageous to apply a barrier layer prior to the CVD or PVD copper deposition or conductor metal deposition. This layer may be of organic or inorganic nature. Suitable barrier layer materials are titanium, titanium nitride, tantalum, tantalum nitride, tungsten nitride, tungsten carbide, silicon carbide, amorphous carbon and mixtures or compounds of these materials with oxygen, carbon and/or hydrogen, e.g. SiCN, SiOCN or SiCH, etc. CVD and PVD processes are preferably used to apply the barrier layer. Standard layer thicknesses are 5–50 nm.

After the conductor metal, in particular copper, has been applied, in accordance with the invention the copper tracks can be passivated. The passivation can take place using conventional processes by means of, for example, e-less CoWP (i.e. a layer of cobalt, tungsten and phosphorus applied by means of electroplating), e-less CoP, Ru, etc. or by means of W, WN or WC deposited selectively and applied by means of CVD.

Passivation of the base and/or side walls after patterning in accordance with step b. may likewise be carried out in a conventional way, for example by depositing a layer of titanium, titanium nitride, tantalum, tantalum nitride, tungsten nitride, tungsten carbide, silicon carbide or similar known barrier layer materials.

Before or after passivation, according to the invention it is preferable for the conductor metal layer or copper layer to be planarized, preferably by means of CMP (Chemical Mechanical Polishing), forming a planar common surface of silicon dioxide and copper (or barrier over copper).

In principle, in accordance with the present invention a common, preferably planar surface of conductor metal and dielectric is to be formed. Step c. is to be understood in such a way that in the case of introduction of a barrier layer or passivation the common surface may also be formed by the barrier layer, passivation layer and dielectric. The common surface may also be formed after chemical mechanical polishing.

In accordance with step d. a layer of an organic dielectric is applied to the layer produced in step c. The organic dielectric used may preferably be one or more of the following compounds which are known per se: polybenzoxazoles (PBO), polybenzimidazoles, polyimides (PI) and/or precursors thereof, such as polyhydroxyamides (PBO precursor) and/or polyamidocarboxylic acids (PI precursors) and polyquinolines, polyquinoxalines, polyarylenes, such as polyphenylenes or polynaphthylenes or polymers as disclosed and claimed in WO 97/10193, i.e. polymers of ethinylaromatic compounds, polyarylene ethers, such as polyphenyl ethers, polynaphthyl ethers, including the fluorinated polyarylene ethers and polynaphthylene ethers disclosed and claimed in Patents U.S. Pat. No. 5,115,082 and U.S. Pat. No. 5,145,936, and the unfluorinated homologs thereof, it being possible for each of the abovementioned organic dielectric layers to contain silicon-, germanium-, boron- or phosphorus-containing organometals.

Other likewise preferred organic dielectrics are photosensitive organic dielectrics, in particular photosensitive polyimides, such as Pimel produced by Asahi Chemical or Probimide produced by Arch Chemical, photosensitive polybenzoxazoles, such as CRC produced by Sumitomo Bakelite or photosensitive benzocyclobutene produced by Dow Chemical.

The organic dielectric is preferably applied dissolved in a suitable solvent. It is applied using conventional processes, for example spray-on or spin-on processes. Preferred solvents are methoxypropyl acetate, ethoxypropyl acetate, ethoxypropylpropionate, N-methylpyrrolidone, gamma-butyrolactone, cyclohexanone and/or cyclopentanone. The application is usually followed by a drying step and if appropriate a conditioning step, the conditioning step being carried out in particular for the purpose of converting precursors into end products.

The step of bringing the coated substrate into contact with the fluorine-containing compound may preferably be carried out by continuously feeding a fluorine-containing gas into a chamber in which the coated substrate is located. After the substrate has been removed from the chamber, copper structures or conductor metal structures which are horizontally separated from one another only by air and have a continuous dielectric layer (organic dielectric) on the top side, remain in place.

The procedure described results in a structure which has air as dielectric between the conductor structures. The result is a k value of virtually 1, which represents the theoretical limit.

The treatment of the fluorine-containing compound does not have to be carried out after each individual layer during fabrication of the semiconductor structure. Rather, it is possible and, in accordance with the invention, preferred for the structure to be completed in a plurality of individual layers with silicon dioxide as dielectric and for this structure then to be brought into contact with the fluorine-containing compound. This constitutes a considerable advantage in manufacturing technology terms. A multilayer structure of this type before and after treatment in accordance with the invention with the fluorine-containing compound in gaseous or liquid form is shown in FIG. 3. Also, the process is not restricted to two layers. It is possible for any desired number of individual layers to be applied to one another and processed. It is also possible for an individual layer with air as dielectric to be produced first of all and then for the further layer(s) to be applied thereto.

FIGS. 1b–e (explanation below) describe a conventional damascene process which can be used in accordance with the invention. In addition, according to the invention it is also possible to use a dual damascene process.

In the case of structures with relatively large spacings, according to the invention it is preferable to incorporate support columns which do not have any electrical function, but rather serve only as mechanical supports (cf. FIG. 2).

It is preferable for an impervious protective ring of metal or barrier tracks with a width of at least 2 μm to be applied all around the edge of the chip, in order to prevent any adverse effect emanating from the chip edge from occurring in the interior of the chip (oxidation or other chemical reactions).

BRIEF DESCRIPTION OF THE DRAWINGS

The present invention is described in more detail below on the basis of exemplary embodiments which, however, are not intended to restrict the scope of protection provided by the claims. In this description, reference is made to the following figures:

FIG. 1 shows a procedure according to the invention for the process using the damascene process.

FIG. 4 shows an embodiment of the present invention in which a contact hole is being produced and a semiconductor structure is being built up further.

DETAILED DESCRIPTION OF THE INVENTION

EXAMPLES

Example 1

Production of Copper Structures

Figure 1A:
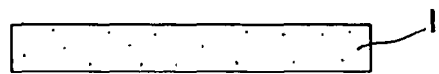
FIG. 1a shows a substrate. This substrate may already include metal or dielectric structures. A barrier or an organic dielectric may also be located on the substrate.
Figure 1B:
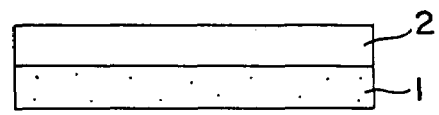
FIG. 1b shows the substrate with a silicon dioxide layer applied.
Figure 1C:
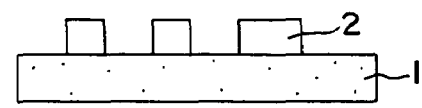
FIG. 1c diagrammatically depicts the state after patterning of the silicon dioxide with the aid of conventional photoresists.
Figure 1D:
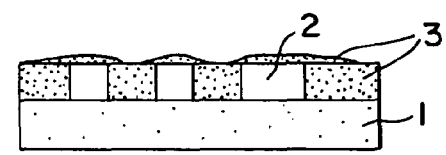
FIG. 1d shows the state after application of copper, e.g. by means of CVD, PVD, electroplating or combinations thereof. If appropriate, a barrier layer can be applied prior to the copper.
Figure 1E:
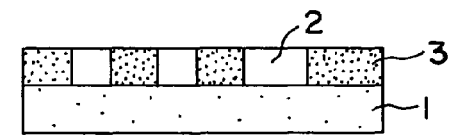
FIG. 1e shows the state after CMP.
Figure 1F:
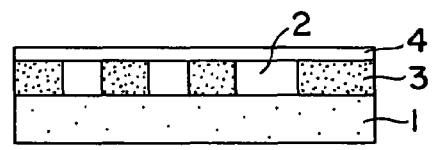
FIG. 1f shows the applied organic dielectric after drying and if appropriate conditioning.

A silicon dioxide layer 2 is applied to a silicon wafer 1 by means of CVD technology and this layer is patterned by means of known resist technology and plasma etching (FIGS. 1a–c). The patterned silicon dioxide layer has a height of 800 nm. A 40 nm thick layer of tantalum is deposited on this layer by means of PVD (Applied Materials Endura apparatus), followed by a 70 nm thick layer of copper 3. Then, the copper layer is electrolytically thickened (Semitool Equinox apparatus) to 1000 nm (FIG. 1d). Then, first of all copper and then tantalum undergo chemical mechanical planarization (IPEC apparatus, RODEL polishing pad, CABOT slurries), cf. FIG. 1e. Then, a polybenzoxazole precursor (poly-o-hydroxyamide) is applied to the planarized surface by spin-on technology from a solution in N-methylpyrrolidone, as organic dielectric 4, produced in accordance with EP 0264678, Example 1, and is dried for 2 minutes at 120° C. on a heating plate. Then, the coated substrate is conditioned in a conditioning furnace (under nitrogen) for 60 minutes at 380° C. The conditioning causes the precursor to be converted into the corresponding polybenzoxazole. The layer thickness of the polybenzoxazole film 4 used as dielectric is 1400 nm. A mixture of $N_2$ and $H_2$ can also be used as gas during the conditioning (FIG. 1f).

Figure 1G:
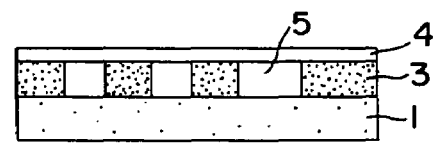
FIG. 1g shows the state after treatment in accordance with the invention with a fluorine-containing compound. There are now air gaps at the locations where silicon dioxide was previously located.
Figure 2:
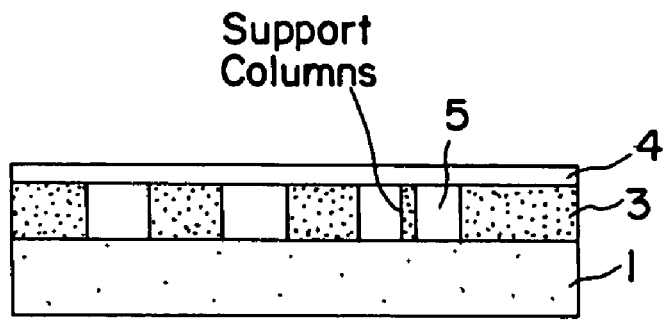
FIG. 2 shows a semiconductor structure according to the invention with a support column in regions with large areas or air gaps.

The substrate is then introduced into a heatable chamber which has a gas inlet and gas outlet. Then, hydrofluoric acid HF is slowly passed through the chamber at a temperature of 80° C. The carrier gas used in this case is nitrogen, which is pumped through concentrated hydrofluoric acid (48% by weight) and carries the latter with it in the vapor phase. After 20 minutes, the chamber is purged with pure nitrogen and the substrate removed from the chamber. Now, at the location previously occupied by silicon oxide, only air 5 remains between the interconnects (FIG. 1g). As an alternative to using tantalum alone, it is also possible for titanium nitride (20 nm) and tantalum together to be applied as barrier.

Example 2

Multilayer Structure

Figure 3A:
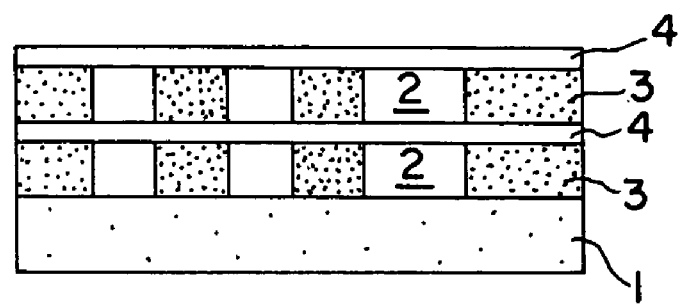
FIG. 3 shows a semiconductor structure with a multilayer construction before (FIG. 3a) and after (FIG. 3b) treatment with the fluorine-containing compound in gaseous or liquid form.
Figure 3B:
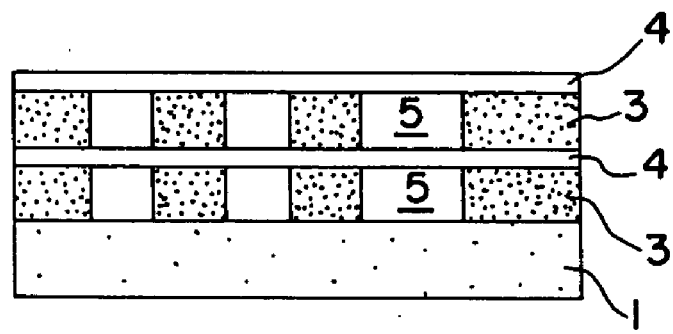

In this case, the substrate used is a structure produced in accordance with Example 1, specifically after conditioning of the organic dielectric (FIG. 1f). Then, just as in example 1, silicon dioxide and copper are deposited by means of CVD, thickened by electroplating and planarized. Then, the polybenzoxazole precursor is once again applied and conditioned (FIG. 3a). The structure is then introduced into a heatable chamber and treated in the same way as in Example 1. The result is the structures corresponding to FIG. 3b.

The process is not restricted to two layers. It is possible for any desired number of layers to be applied on top of one another and processed. It is also possible first of all to produce a layer with air as dielectric and then to apply the further layer(s) thereto.

Example 3

Production of a Contact Hole and Further Structure

Figure 4A:
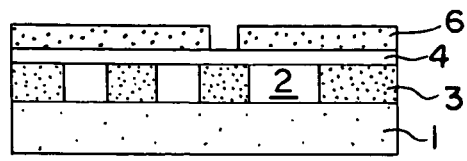
FIG. 4a Photopatterning of the resist.
Figure 4B:
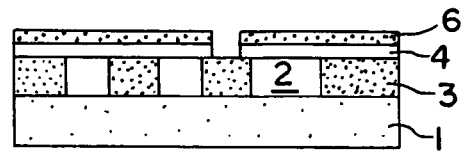
FIG. 4b Etching of the dielectric with resist as mask.
Figure 4C:
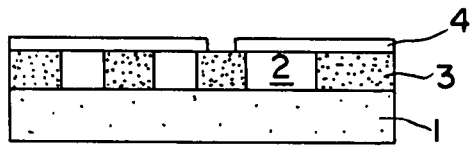
FIG. 4c After stripping/removal of the resist.
Figure 4D:
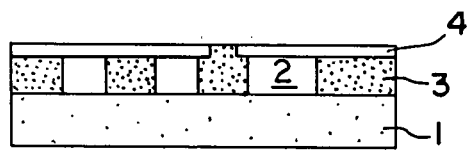
FIG. 4d Electroplating, i.e. filling of the contact hole.
Figure 4E:
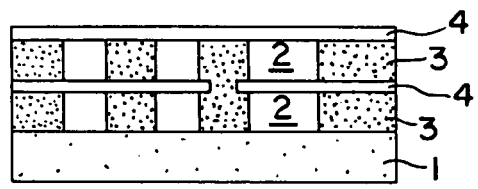
FIG. 4e Repetition of the steps from FIG. 1b to FIG. 1f.
Figure 4F:
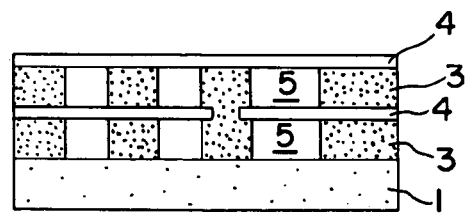
FIG. 4f State after treatment according to the invention in a heatable chamber.

A photoresist 6 which can be silylated in accordance with EP 494383/Example 1 is deposited on the structure with organic dielectric on top produced in accordance with Example 1, and this photoresist is then exposed through a contact hole mask, developed and silylated (FIG. 4a). Then, the dielectric in the contact holes is etched for 100 seconds by means of oxygen plasma (with the resist being used as an etching mask), so that the top side of the copper track 3 is uncovered (FIG. 4b). To remove the oxidized copper at the surface, etching is continued for a further 20 seconds with argon plasma. The resist layer which remains above the dielectric is removed (stripped) by treatment for 2 minutes with N-methylpyrrolidone, and the substrate is dried for 60 seconds at 120° C. (FIG. 4c). The contact hole with the copper uncovered at the bottom is then filled with copper 3 by electroplating (FIG. 4d). Then, in accordance with Example 1, the structure obtained in this way is thickened by a further layer (in accordance with FIGS. 1b–f), resulting in the structure corresponding to FIG. 4e. After the gas treatment in the chamber in accordance with Example 1, 2 layers of interconnects with air as dielectric and with a layer of contact holes between them is obtained (FIG. 4f).

Example 4

Production of Copper Structures

In this example, the procedure is exactly the same as in Example 1, except for the following differences: instead of a polybenzoxazole precursor, a commercially available dielectric SiLK produced by Dow Chemical (cf. WO97/10193) is used. The result is the same as in Example 1.

Example 5

Production of a Contact Hole and Further Structure

The example is carried out exactly as in Example 3, except that in this case the dielectric from Example 4 was used. The result is the same as in Example 3.

Example 6

Use of a Photosensitive Organic Dielectric in the Structure

Figure 5:
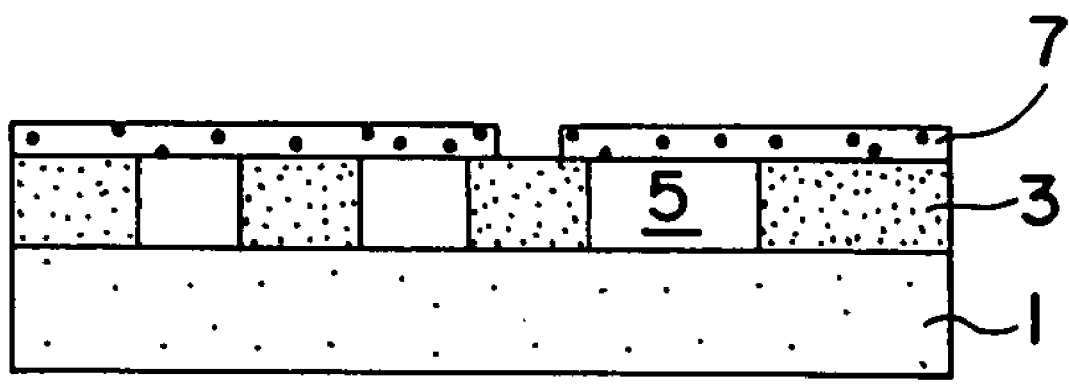
FIG. 5 shows a structure which has been treated in accordance with the invention after treatment as in FIG. 1, with a photosensitive organic dielectric having been used as organic dielectric into which contact holes were etched and then a treatment with a fluorine-containing compound in accordance with the present invention was carried out.

In this example, the steps corresponding to FIGS. 1a–e are carried out in exactly the same way as in Example 1. Then, the solution of a photopatternable polybenzoxazole precursor as photosensitive organic dielectric 7 in accordance with EP 0264678/Example 2 is spun onto the planarized surface of Cu/SiO$_2$, dried for 100 seconds at 110° C. on a heating plate and then subjected to polychromatic exposure through a contact hole mask. After developing for 90 seconds using the developer AZ 303 (diluted 1:6 with water) and conditioning in a conditioning furnace (under nitrogen, 60 minutes at 380° C.), the result is a continuous film of the organic dielectric with a thickness of 1400 nm and with contact holes above the tracks made from copper (FIG. 4c). The substrate is then introduced into a solution of ammonium fluoride in methanol at 60° C. and treated with the solution for 25 minutes with gentle stirring. This is followed by rinsing with methanol and drying for 15 minutes at 150° C. under nitrogen. After this treatment, only air remains between the interconnects at the locations previously occupied by silicon oxide (cf. FIG. 5).

Example 7

The example is carried out exactly as in Example 6, except for the following differences: in this case, the photosensitive polyimide Pimel 7636 produced by Asahi was used as photosensitive dielectric 7. A negative mask was used for this purpose, since the polyimide—unlike the oxazole referred to above—can be negatively patterned. Development took place in a mixture (1:1 by volume) of gamma-butyrolactone and xylene. The result is the same as in Example 3.

What is claimed is:
1. Process for integrating air as dielectric in semiconductor devices, comprising the steps of:
   a. applying a layer of silicon dioxide as a dielectric patterned to a substrate;
   b. patterning the applied dielectric layer;
   c. applying a conductor metal for the patterned dielectric layer and forming a common surface from the conductor metal and the dielectric;
   d. applying a layer of an organic dielectric to the layer produced in step c.; and
   e. bringing the coated substrate produced in this way into contact with a fluorine-containing compound in order to form an arrangement which has air as dielectric between conductor structures and has a continuous dielectric layer on the top side.
2. Process according to claim 1, wherein the fluorine-containing compound is in gas form.

3. Process according to claim 1, wherein the fluorine-containing compound is a fluorine-containing hydrocarbon compound with 1–4 C atoms, a perfluorinated hydrocarbon compound with 1–4 C atoms, a fluorine-containing nitrogen compound with 1–2 N atoms, a chlorofluorocarbon compound with 1–4 C atoms, and/or HF, $F_2$, $BF_3$, $PF_3$, ClF, $ClF_3$, $ClF_5$, $XeF_2$, $SF_4$, $SO_2F_2$, $SF_6$ or a mixture thereof.

4. Process according claim 1, wherein the fluorine-containing compound is one or more of the following compounds: $CF_4$, $CHF_3$, $CH_3F$, $C_2F_6$, $CH_2F_2$, $C_2H_2F_4$, $C_2Cl_2F_4$, $C_2Cl_3F_3$, $C_2ClF_5$, $C_2Cl_4F_2$, and/or $NF_3$.

5. Process according to claim 1, wherein the fluorine-containing compound is present in the form of a mixture with $NH_3$, $O_2$ and/or $H_2O$.

6. Process according to claim 1, wherein the fluorine-containing compound is used in the form of a solution.

7. Process according to claim 6, wherein the fluorine-containing compound is present in the form of an aqueous solution of HF, KF, NaF, LiF, $NH_4HF_2$ or $NH_4F$ or mixtures thereof.

8. Process according to claim 1, wherein the step of bringing the substrate into contact with the fluorine-containing gaseous compound takes place at 20–200° C.

9. Process according to claim 1, wherein the step of bringing the substrate into contact with the fluorine-containing compound is carried out over 5–60 min.

10. Process according to claim 1, wherein the substrate is selected from the group consisting of silicon, germanium, microelectronically processed Si or Ge substrates; glass, metal-glass combinations; or Si or Ge with electrically semiconducting polymers.

11. Process according to claim 1, wherein copper, silver, aluminum or alloys of Al, Cu and Si is used as conductor metal.

12. Process according to claim 1, wherein copper is used as conductor metal.

13. Process according to claim 1, wherein one or more of the following compounds which are known per se are used as organic dielectric: polybenzoxazoles (PBO), polybenzimidazoles, polyimides (PI), and/or precursors thereof, polyquinoxalines, polyarylenes, fluorinated or unfluorinated polyarylene ethers, polynaphthyl ethers, each of which compounds may contain silicon-, germanium-, boron- or phosphorus-containing organometals.

14. Process according to claim 1, wherein the organic dielectric used is a photosensitive dielectric, photosensitive polybenzoxazole or photosensitive benzocyclobutene.

15. Process according to claim 1, wherein after step c. a planarization step is carried out.

16. Process according to claim 1, wherein steps a. to d. are carried out repeatedly before the step of bringing the substrate into contact with the fluorine-containing compound, so that a multilayer structure is brought into contact with the fluorine-containing compound.

17. Process according to claim 1, wherein a barrier layer is applied before the conductor metal is applied.

18. Process according to claim 1, wherein the barrier layer is made from one or more of the following materials: titanium, titanium nitride, tantalum, tantalum nitride, tungsten nitride, tungsten carbide, silicon carbide, amorphous carbon and mixtures or compounds of these materials with oxygen, carbon and/or hydrogen.

19. Process according to claim 1, wherein the surface of the conductor metal is passivated before the organic dielectric is applied.

20. Process according to claim 1, wherein mechanical support elements are integrated in order to increase the mechanical strength of the air-dielectric layer.

* * * * *